(12) United States Patent
Liau

(10) Patent No.: US 6,213,332 B1
(45) Date of Patent: Apr. 10, 2001

(54) INTERFACE CARD HOLDER PLATE HOLDING DOWN DEVICE MOUNTING ARRANGEMENT FOR COMPUTER

(75) Inventor: Jian Ying Liau, Taoyuan Hsien (TW)

(73) Assignee: Enlight Corporation, Taoyuan Hsien (TW)

( * ) Notice: Subject to any disclaimer, the term of this patent is extended or adjusted under 35 U.S.C. 154(b) by 0 days.

(21) Appl. No.: 09/658,588

(22) Filed: Sep. 8, 2000

(51) Int. Cl.[7] .................................................. B65D 49/02
(52) U.S. Cl. ........................................ 220/478; 220/23.83
(58) Field of Search .................................... 220/478, 479, 220/23.83, 4.03; 312/138.1

(56) References Cited

U.S. PATENT DOCUMENTS

| | | | |
|---|---|---|---|
| 2,270,914 | * 1/1942 | Williams | 220/478 |
| 2,840,258 | * 6/1958 | Caesar et al. | 220/478 |
| 4,768,671 | * 9/1988 | Horntrich | 220/478 |
| 5,800,027 | * 9/1998 | Dunn | 220/478 |

* cited by examiner

Primary Examiner—Joseph M. Moy
(74) Attorney, Agent, or Firm—Dougherty & Troxell

(57) ABSTRACT

An interface card holder plate holding down device mounting arrangement includes a holding down device pivoted to a locating frame at one side of an opening in the back panel of a computer case and adapted to hold down interface card holder plates on the locating frame, the holding down device having at least one hook adapted for hooking in a respective retaining hole on the back panel of the computer case to hold the holding down device in the close position, and a ribbed structure formed integral with the base frame and adapted to hold down interface card holder plates on the locating frame when the holding down device is closed on the opening of the back panel of the computer case.

2 Claims, 5 Drawing Sheets

INTERFACE CARD HOLDER PLATE HOLDING DOWN DEVICE MOUNTING ARRANGEMENT FOR COMPUTER

BACKGROUND OF THE INVENTION

The present invention relates to an interface card holder plate holding down device mounting arrangement for computer, and more particularly to such an interface card holder plate holding down device mounting arrangement in which a holding down device is pivoted to a locating frame at the back panel of a computer case, and turned between an open position where installed interface card holder plates are allowed to be disconnected from the locating frame, and a close position where installed interface card holder plates are held down by the holding down device.

A computer case has a locating frame at the back panel thereof for the mounting of interface card holder plates for holding interface cards. Screws and nuts are commonly used to secure interface card holder plates to the locating frame. There is another interface card holder plate mounting design, which eliminates the use of screws and nuts to secure interface card holder plates to the locating frame of a computer case. However, when installing multiple interface card holder plates in the locating frame of the computer case, the user must hold the interface card holder plates on the locating frame with one hand, and fasten the fixation device to the locating frame of the computer case to fix the interface card holder plates with the other hand. During installation, the interface card holder plates may displace or slip from the hand.

SUMMARY OF THE INVENTION

The invention has been accomplished to provide. It is one object of the present invention to provide an interface card holder plate holding down device mounting arrangement, which eliminates the aforesaid problems. According to one aspect of the present invention, a holding down device is pivoted to the locating frame at the back panel of the computer case, and turned between a close position and an open position. When closed, the holding down device holds down interface card holder plates on the locating frame of the computer case. When opened, the holding down device is disengaged from the interface card holder plates, enabling the interface card holder plates to be disconnected from the locating frame of the computer case. According to another aspect of the present invention, the interface card holder plates each have a recessed portion adapted for engagement with a respective raised portion of the locating frame of the computer case for positive positioning.

DETAILED DESCRIPTION OF THE PREFERRED EMBODIMENT

Figure 1:
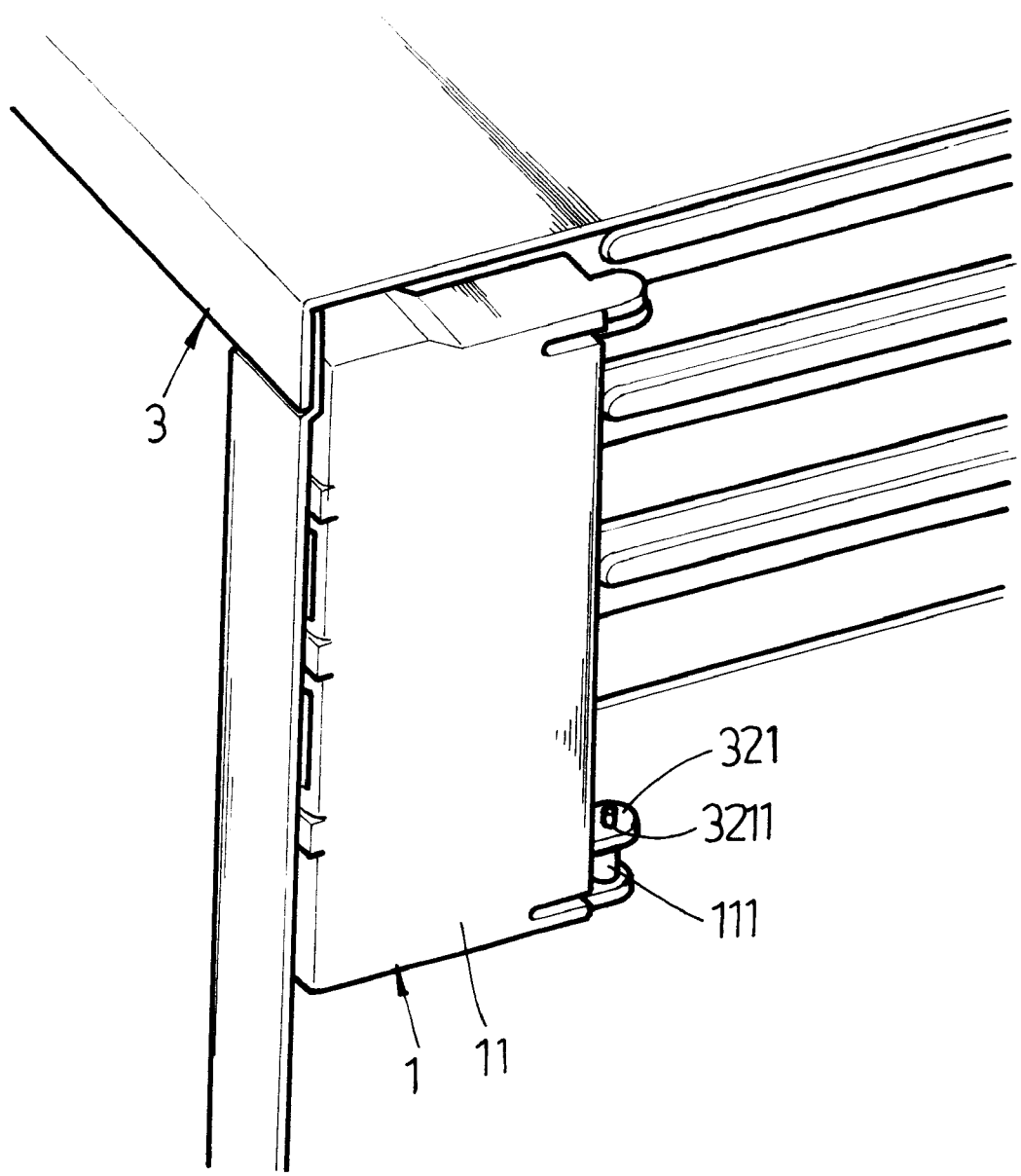
FIG. 1 is an elevational view of the present invention, showing the holding down device closed on the back panel of the computer case.
Figure 2:
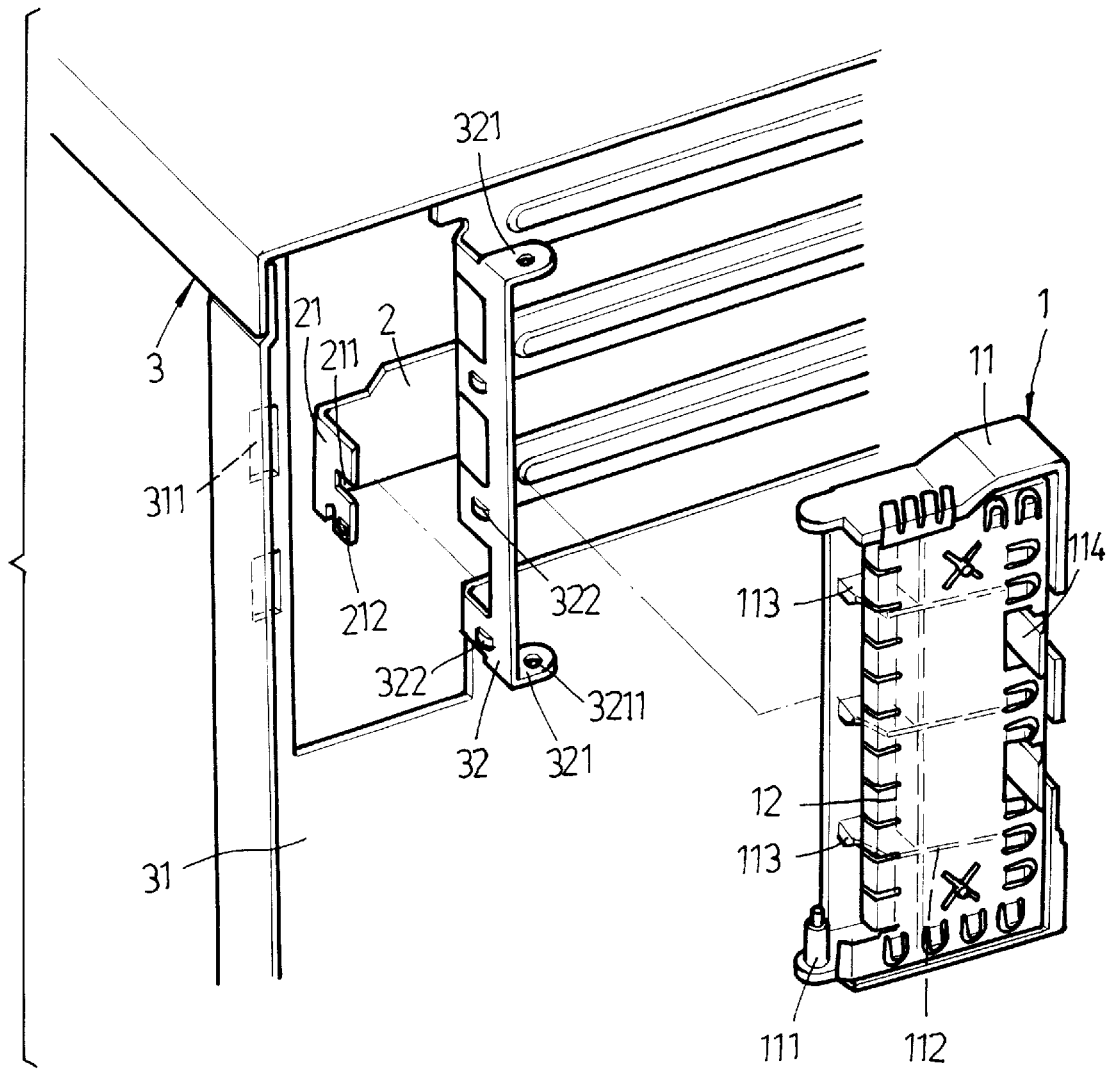
FIG. 2 is an exploded view of FIG. 1.
Figure 3:
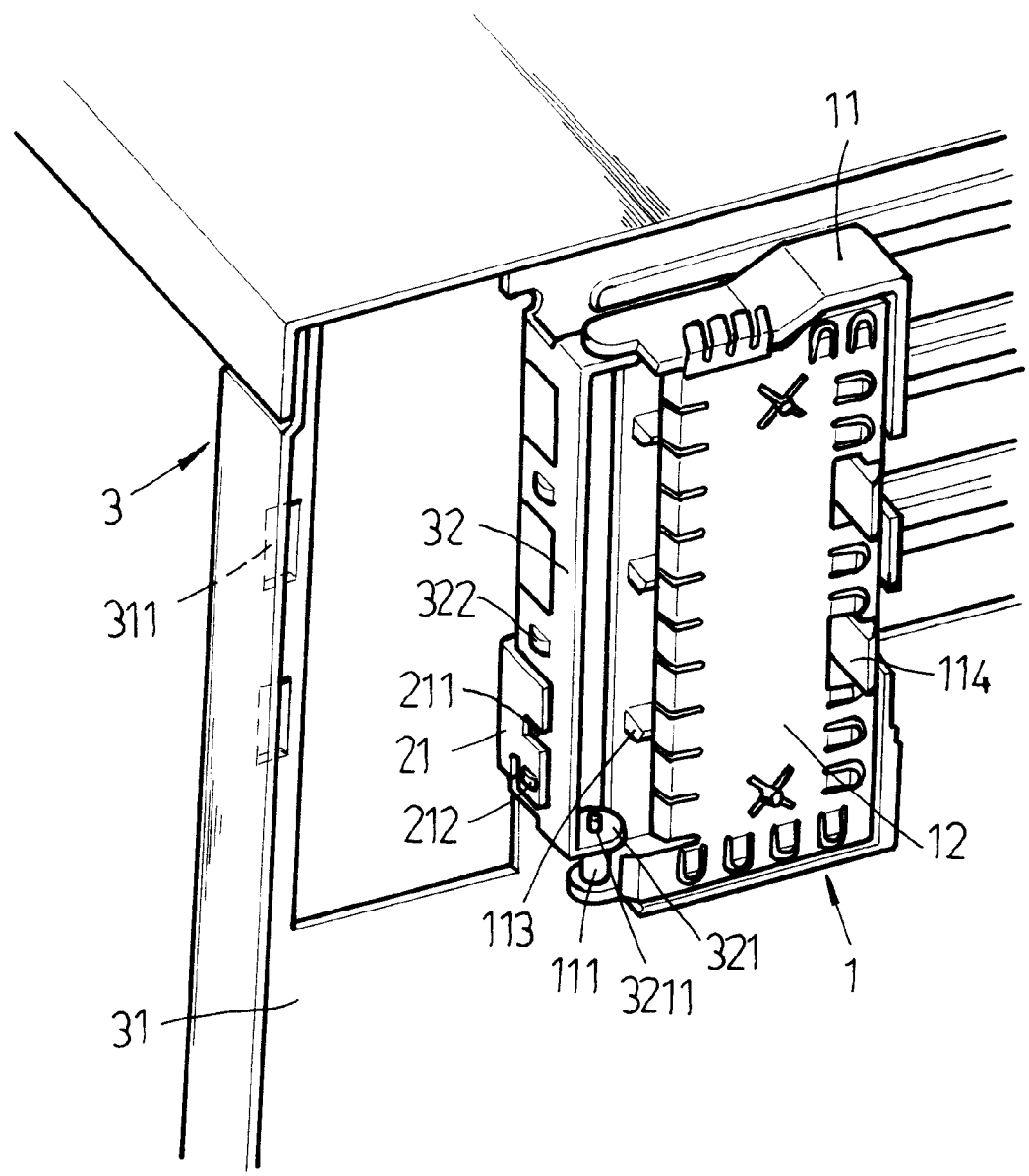
FIG. 3 illustrates the holding down device opened from the opening of the back panel of the computer case according to the present invention.

Referring to FIGS. 1 and 2, the computer case 3 comprises an opening in the back panel 31 thereof, a locating frame 32 forwardly perpendicularly extended from one side of the opening for the positioning of multiple interface card holder plates 2, and at least one, for example, multiple retaining holes 311 vertically spaced at the other side of the opening. The locating frame 32 comprises two lugs 321 horizontally disposed at top and bottom sides thereof, and a plurality of equally vertically spaced raised portions 322. The lugs 321 each have a pivot hole 3211. A holding down device 1 is pivoted to the locating frame 32. The holding down device 1 comprises a base frame 11, a ribbed structure 112 formed integral with one side wall, namely, the inner side wall of the base frame 11, the ribbed structure 112 having vertically spaced protruded press portions 113, two pivots 111 respectively disposed at top and bottom ends of one lateral side of the base frame 11 and adapted for coupling to the pivot hole 3211 of each lug 321 of the locating frame 32, and multiple hooks 114 vertically spaced along the other lateral side of the base frame 11 corresponding to the retaining holes 311.

Referring to FIGS. from 3 through 5 and FIG. 2 again, the pivots 111 of the holding down device 1 are respectively coupled to the pivot hole 3211 of each lug 321, enabling the holding down device 1 to be turned relative to the locating frame 32 between the close position and the open position to close/open the opening in the back panel 31 of the computer case 3. When turned to the close position, the hooks 114 are respectively hooked in the retaining holes 311 to secure the holding down device 1 in the close position. An interface card holder plate 2 in accordance with the present invention comprises a coupling end 21 attached to the locating frame 32, a recessed portion 212 disposed at the coupling end 21 and forced into engagement with one raised portion 322 of the locating frame 32, and an end notch 211 disposed at the coupling end 21 corresponding to one protruded press portion 113 of the holding down device 1. When the holding down device 1 is closed on the back panel 31 of the computer case 3 after installation of multiple interface card holder plates 2 in the locating frame 32, the ribbed structure 112 of the holding down device 1 is pressed on the coupling end 21 of each interface card holder plate 2 against the locating frame 32, and the protruded press portions 113 of the ribbed structure 112 of the holding down device 1 are respectively engaged into the end notch 211 of the coupling end 21 of each interface card holder plate 2, and therefore the interface card holder plates 2 are positively secured to the locating frame 32, and at the same time the hooks 114 of the holding down device 1 are respectively hooked in the retaining holes 311 of the back panel 31 of the computer case 3.

Figure 6:
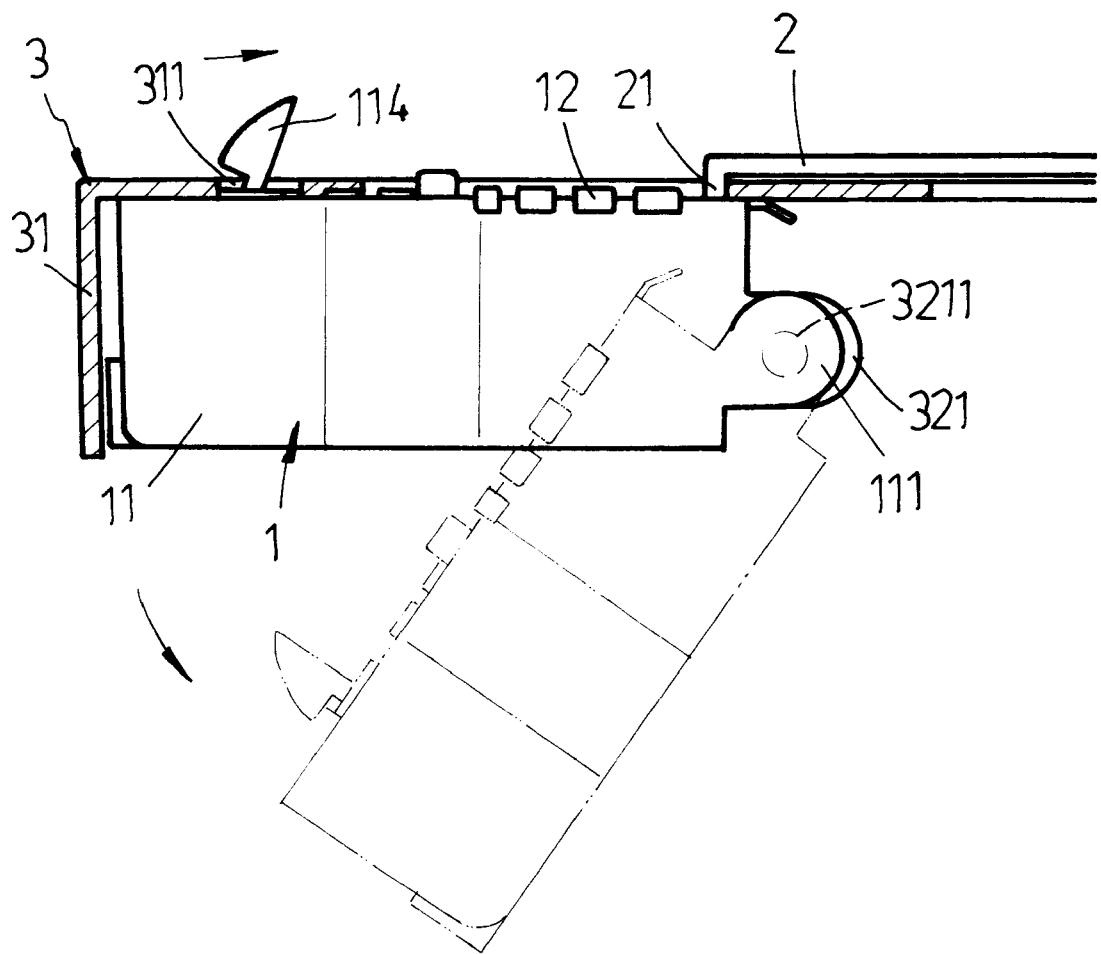
FIG. 6 is a schematic drawing showing the holding down device turned relative to the locating frame between the close position and the open position.

Referring to FIG. 6, when replacing the interface card holder plates 2, the holding down device 1 is turned outwards from the back panel 31 of the computer case 3 to disengage the hooks 114 and the ribbed structure 112 from the retaining holes 311 and the interface card holder plates 2, enabling the interface card holder plates 2 to be disconnected from the locating frame 32.

Figure 4:
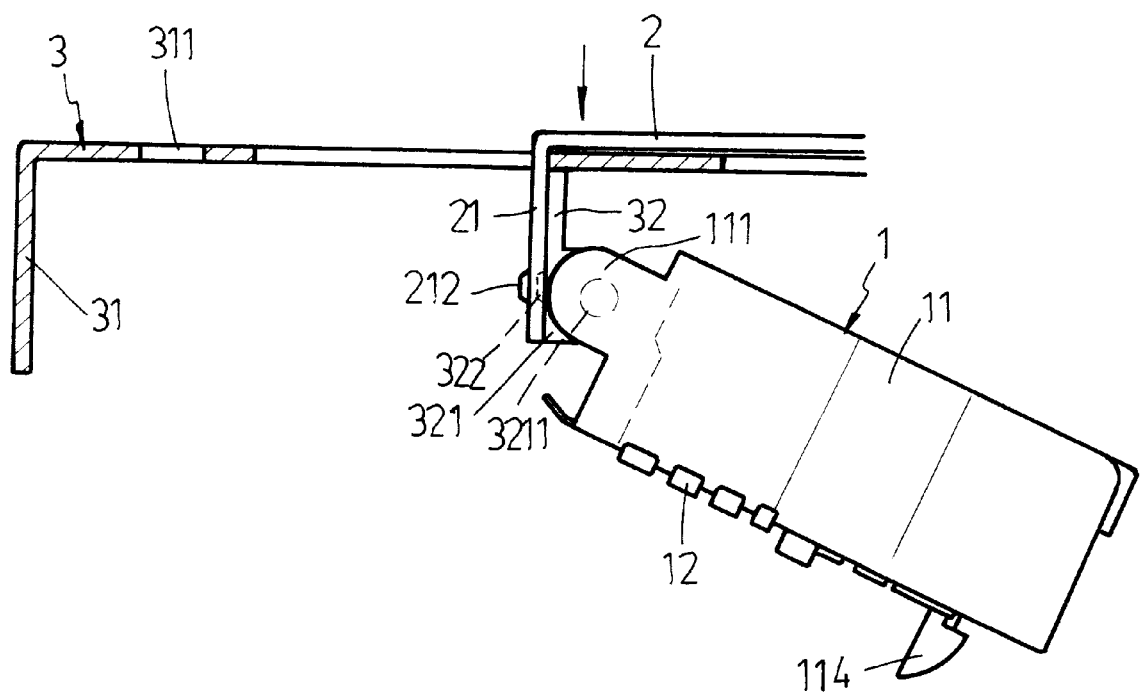
FIG. 4 is a top view of the present invention, showing the holding down device turned relative to the locating frame and opened from the opening of the back panel of the computer case.
Figure 5:
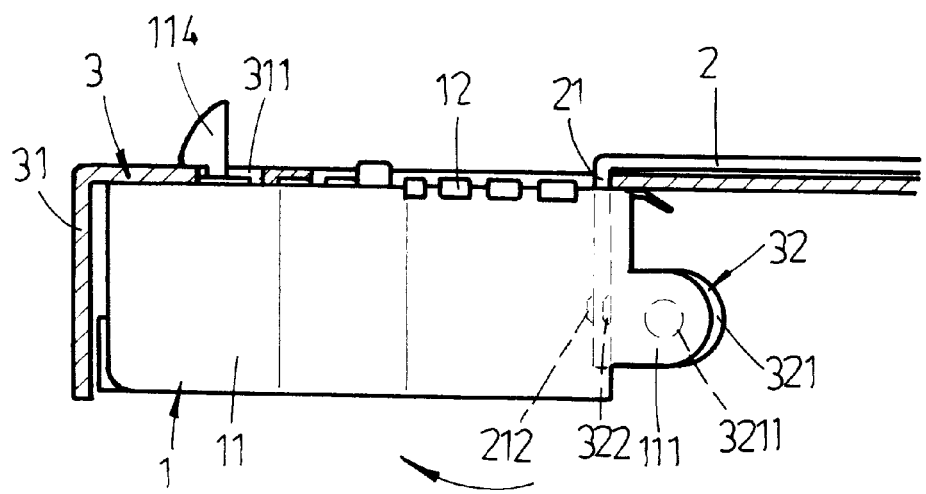
FIG. 5 is another top view of the present invention, showing the holding down device closed on the opening of the back panel of the computer case.

Referring to FIGS. 2, 4 and 5 again, a metal shielding element 12 is installed in the holding down device 1, and adapted to stop magnetic waves from escaping out of the computer.

While only one embodiment of the present invention has been shown and described, it will be understood that various modifications and changes could be made thereunto without departing from the spirit and scope of the invention disclosed.

What the invention claimed is:

1. An interface card holder plate holding down device mounting arrangement comprising a holding down device installed in a locating frame at one side of an opening in the back panel of a computer case and adapted to hold down interface card holder plates on said locating frame, wherein said holding down device comprises a base frame, a ribbed structure formed integral with an inner side wall of said base frame and adapted to hold down interface card holder plates on said locating frame, said ribbed structure having vertically spaced protruded press portions adapted to engage into an end notch on each interface card holder plate being mounted on said locating frame, two pivots disposed at top and bottom ends of one lateral side of said base frame and respectively pivoted to respective pivot holes on said locating frame for enabling said holding down device to be turned relative to said locating frame to close/open the opening of the back panel of said computer case, and at least one hook disposed at an opposite lateral side of said base frame and adapted for hooking in a respective retaining hole on the back panel of said computer case.

2. The interface card holder plate holding down device mounting arrangement of claim 1 wherein said holding down device comprises a metal shielding element covered on said base frame for electromagnetic interference protection.

* * * * *